(12) United States Patent
Ahn

(10) Patent No.: US 9,076,958 B2
(45) Date of Patent: Jul. 7, 2015

(54) RESISTIVE MEMORY DEVICE AND METHOD OF MANUFACTURING THE SAME

(71) Applicant: SK hynix Inc., Gyeonggi-do (KR)

(72) Inventor: Young Soo Ahn, Gyeonggi-do (KR)

(73) Assignee: SK Hynix Inc., Gyeonggi-do (KR)

( * ) Notice: Subject to any disclaimer, the term of this patent is extended or adjusted under 35 U.S.C. 154(b) by 145 days.

(21) Appl. No.: 13/844,868

(22) Filed: Mar. 16, 2013

(65) Prior Publication Data
US 2014/0160837 A1 Jun. 12, 2014

(30) Foreign Application Priority Data
Dec. 12, 2012 (KR) .................. 10-2012-0144248

(51) Int. Cl.
| G11C 11/00 | (2006.01) |
| H01L 45/00 | (2006.01) |
| G11C 13/00 | (2006.01) |
| H01L 27/24 | (2006.01) |
| G11C 16/04 | (2006.01) |

(52) U.S. Cl.
CPC ............ H01L 45/06 (2013.01); G11C 13/0004 (2013.01); G11C 13/0069 (2013.01); G11C 13/0097 (2013.01); G11C 16/0483 (2013.01); G11C 2213/18 (2013.01); G11C 2213/53 (2013.01); H01L 45/1233 (2013.01); H01L 45/144 (2013.01); H01L 27/2454 (2013.01); H01L 27/2481 (2013.01)

(58) Field of Classification Search
CPC .................. H01L 27/11582; H01L 27/11556; H01L 27/1157; G11C 2213/71; G11C 11/06035; G11C 11/063; G11C 13/0004; G11C 13/0069

USPC .......................... 365/148, 163, 135, 137, 134
See application file for complete search history.

(56) References Cited

U.S. PATENT DOCUMENTS

| 8,169,819 B2 | 5/2012 | Shima et al. | |
| 8,173,987 B2 | 5/2012 | Lung | |
| 8,198,670 B2 | 6/2012 | Aoyama | |
| 2010/0237400 A1* | 9/2010 | Aoyama ....................... | 257/324 |
| 2011/0316063 A1* | 12/2011 | Tang et al. .................... | 257/314 |
| 2012/0320698 A1* | 12/2012 | Itagaki et al. ................. | 365/218 |
| 2013/0223126 A1* | 8/2013 | Kwak et al. ................... | 365/148 |

FOREIGN PATENT DOCUMENTS

| KR | 1020110100958 | 9/2011 |
| KR | 1020110132865 | 12/2011 |

OTHER PUBLICATIONS

M. Kinoshita et al., "Scalable 3-D Vertical chain-cell-type phase-change memory with 4F2 poly-Si diodes," IEEE, 2012, pp. 35-36.
"Next-generation non-volatile memory device," Physics & High Technology, Sep. 2005, pp. 2-7.
"Non-volatile memory technology using phase change material," Physics & High Technology, Sep. 2005, pp. 8-19.

* cited by examiner

*Primary Examiner* — Fernando Hidalgo
(74) *Attorney, Agent, or Firm* — IP & T Group LLP

(57) ABSTRACT

A resistive memory device includes word lines stacked on top of one another, at least one first selection line formed over the word lines, a first channel layer passing through the word lines and the first selection line, a first phase change material layer formed in the first channel layer and overlapping the word lines, and a first insulating layer formed in the first channel layer and overlapping the first selection line.

17 Claims, 9 Drawing Sheets

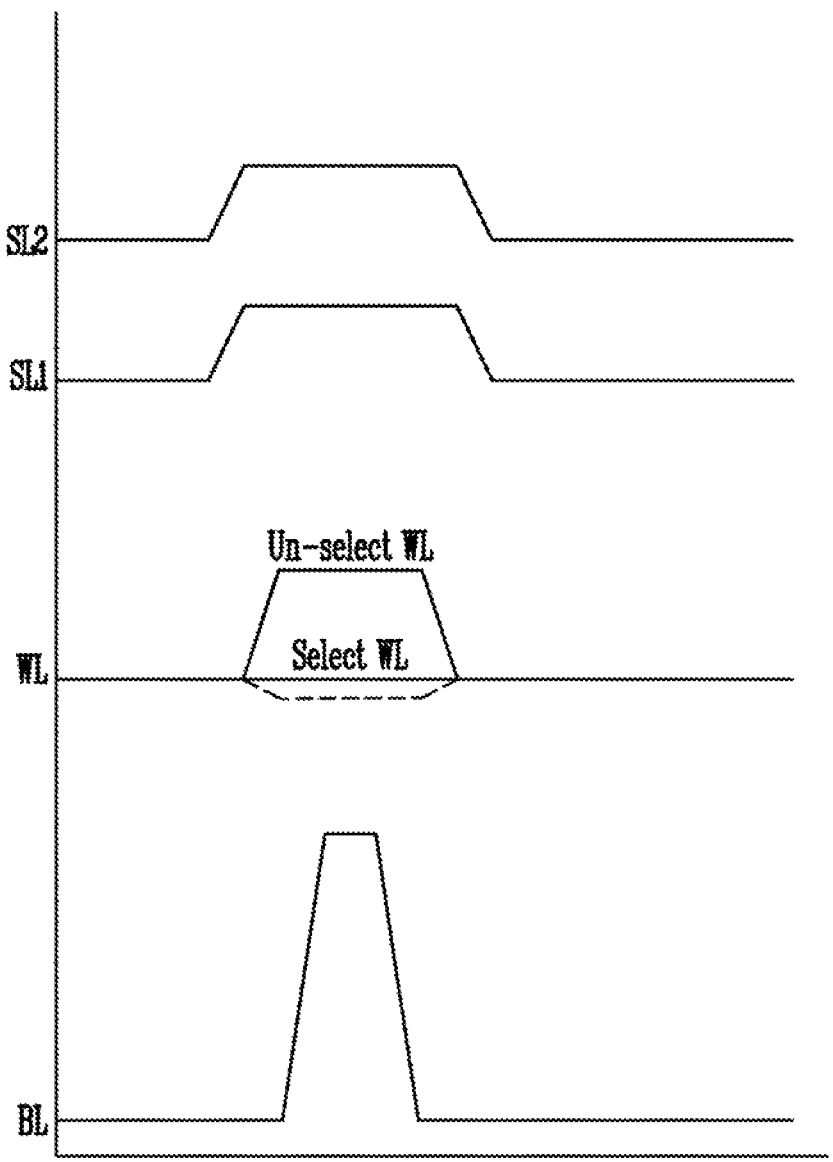

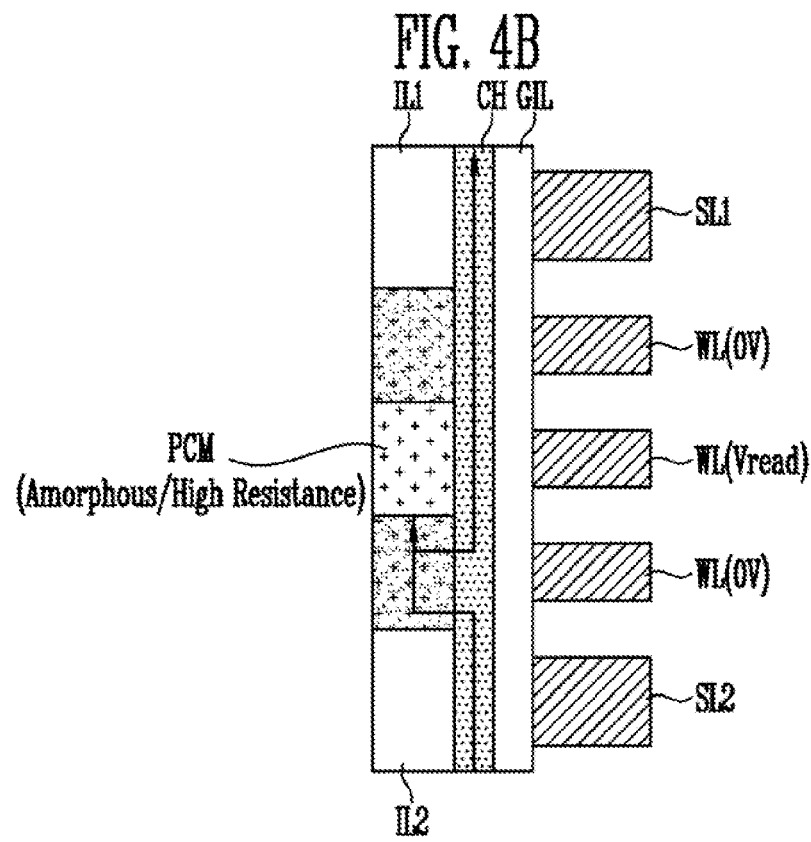
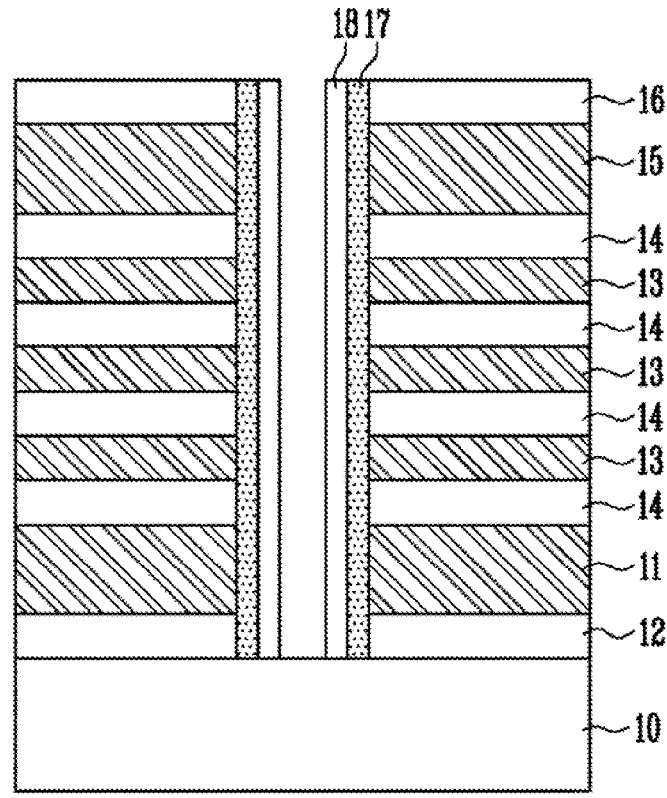

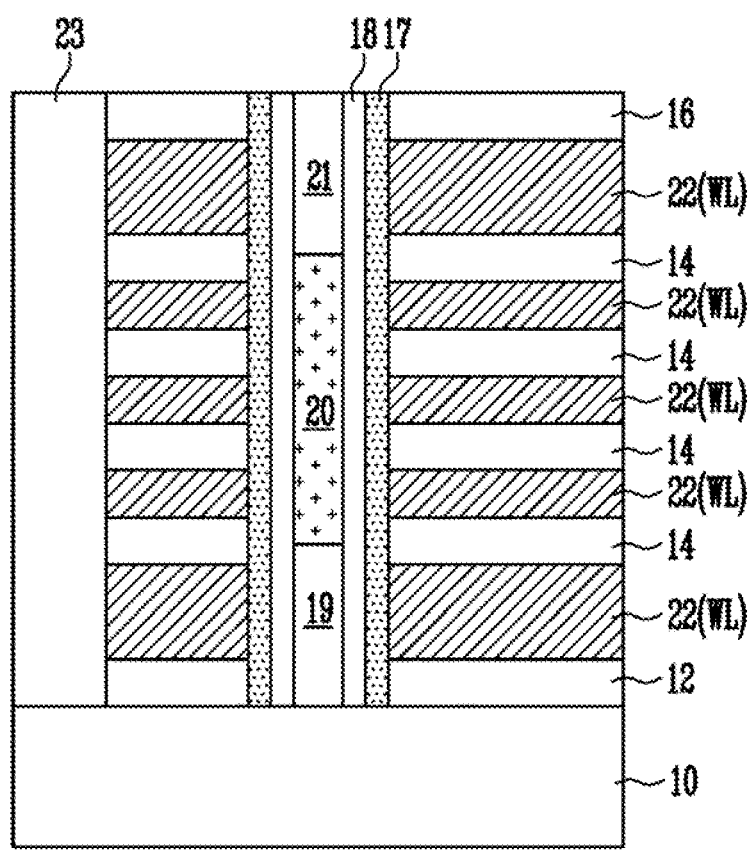

RESISTIVE MEMORY DEVICE AND METHOD OF MANUFACTURING THE SAME

CROSS-REFERENCE TO RELATED APPLICATION

The present application claims priority of Korean patent application number 10-2012-0144248 filed on Dec. 12, 2012, the entire disclosure of which is incorporated herein by reference in its entirety.

BACKGROUND

1. Field of Invention

Various embodiments of the present invention relate to a non-volatile memory device and a method of manufacturing the same and, more particularly, to a resistive memory device and a method of manufacturing the same.

2. Description of Related Art

A non-volatile memory device is a memory device that may retain the stored data even when not powered. A non-volatile memory device may have data storage methods varying depending on the material used to form a data storage layer. A phase change memory device that uses a phase change material layer as a data storage layer has been proposed.

A phase change material layer has low resistance in a crystalline state and high resistance in an amorphous state. In general, the crystalline state is referred to as the set state, which indicates data of "0". In addition, the amorphous state is referred to as the reset state, which indicates data of "1".

A phase change memory device may supply a set pulse or a reset pulse to a phase change material layer and write data by using Joule heating generated thereby. More specifically, a phase change material may be heated to its melting point or higher by using a reset pulse and may then be rapidly cooled to the amorphous state, so that data of may be written. In addition, the phase change material may be heated in a temperature range between the crystallization temperature and the melting point, and then slowly cooled to the crystalline state, so that data of "0" may be written.

However, conventional phase change memory devices in which memory cells are fabricated in a single layer over a substrate may have reached physical limits in increasing their degree of integration. In addition, in conventional phase change memory devices, since data are written in units of memory cells, it may take a long driving time.

BRIEF SUMMARY

Exemplary embodiments of the present invention relate to a resistive memory device appropriate for increasing a driving speed and a degree of integration, and a method of manufacturing the same.

A resistive memory device according to an exemplary embodiment of the present invention may include word lines stacked on top of one another, at least one first selection line formed over the word lines, a first channel layer passing through the word lines and the first selection line, a first phase change material layer formed in the first channel layer and overlapping the word lines, and a first insulating layer formed in the first channel layer and overlapping the first selection line.

A method of manufacturing a resistive memory device according to another exemplary embodiment of the present invention may include alternately forming a plurality of first material layers and a plurality of second material layers with each other, alternately forming at least one third material layer and at least one fourth material layer with each other on the plurality of first and second material layers, forming at least one hole through the first to fourth material layers, forming a channel layer in the hole, forming a first phase change material layer in the channel layer, forming a first recessed region in the channel layer, and forming a first insulating layer in the first recessed region.

BRIEF DESCRIPTION OF THE DRAWINGS

FIG. 2B is a timing diagram illustrating program operation conditions of a resistive memory device according to an embodiment of the present invention.

FIG. 3 and FIGS. 4A and 4B are cross-sectional views illustrating a current path of a resistive memory device according to an embodiment of the present invention.

FIGS. 5A to 5D are cross-sectional views illustrating a process flow for a method of manufacturing a resistive memory device according to an embodiment of the present invention.

DESCRIPTION OF EMBODIMENTS

Figure 1A:
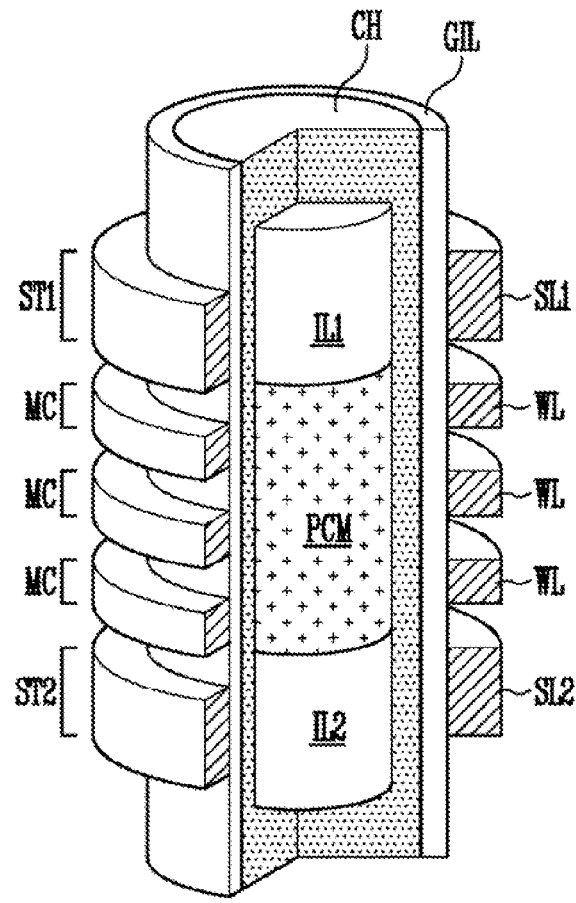
FIGS. 1A and 1B are perspective views illustrating structures of a resistive memory device and a memory cell, respectively, according to an embodiment of the present invention.

Hereinafter, various embodiments of the present disclosure will be described in detail with reference to the accompanying drawings. In the drawings, a thicknesses and a distance of components are exaggerated compared to an actual physical thickness and interval for convenience of illustration. In the following description, detailed explanation of known related functions and constitutions may be omitted to avoid unnecessarily obscuring the subject manner of the present invention. Like reference numerals refer to like elements throughout the specification and drawings. It should be readily understood that the meaning of "on" and "over" in the present disclosure should be interpreted in the broadest manner such that "on" means not only "directly on" but also "on" something with an intermediate feature(s) or a layer(s) therebetween, and that "over" means not only directly on top but also on top of something with an intermediate feature(s) or a layer(s) therebetween.

Figure 1B:
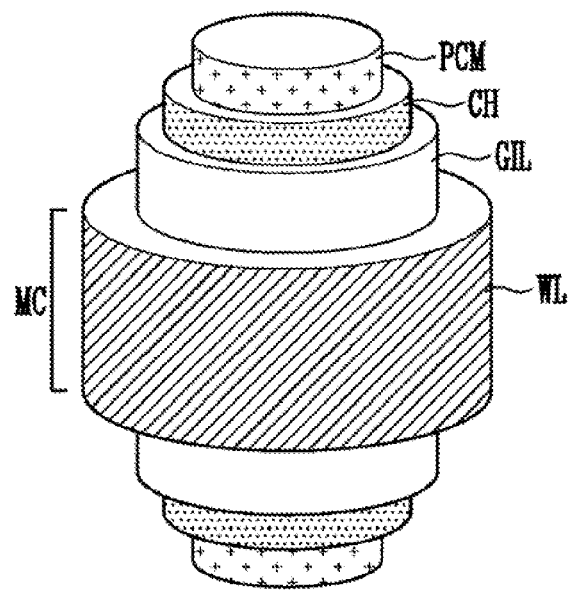

FIGS. 1A and 1B are perspective views illustrating structures of a semiconductor memory device and a memory cell, respectively, according to an embodiment of the present invention.

As illustrated in FIGS. 1A and 1B, a resistive memory device according to an embodiment of the present invention may include word lines WL, at least one first selection line SL1, a channel layer CH, a phase change material layer PCM and a first insulating layer IL1. The word lines WL may be stacked on top of one another. The at least one first selection line SL1 may be formed over the word lines WL. The channel layer CH may pass through the word lines WL and the first selection line SL1. The phase change material layer PCM may be formed in the channel layer CH and overlap the word lines WL. The first insulating layer IL1 may be formed in the channel layer CH and overlap the first selection line SL1.

The resistive memory device may further include at least one second selection line SL2 and a second insulating layer IL2. The second selection line SL2 may be formed under the word lines WL and surround the channel layer CH. The second insulating layer IL2 may be formed in the channel layer CH and overlap the second selection line SL2. In addition, the resistive memory device may further include a gate insulating layer GIL that surrounds the channel layer CH.

The phase change material layer PCM may include a material whose crystallinity changes depending on the amount of current, for example, a Ge—Sb—Te-based material. The phase change material layer PCM may have an amorphous phase or a crystalline phase. The phase change material layer PCM may have greater resistance in the amorphous phase than that in the crystalline phase. Data may be stored using this difference in resistance.

In addition, the phase change material layer PCM may have a pillar shape including a central portion completely filled, a tubular shape including an open central portion, or a combination thereof. When the phase change material layer PCM has a tubular shape, an open central portion thereof may be filled with an insulating layer. The phase change material layer PCM may overlap the word lines WL and may not overlap the first and second selection lines SL1 and SL2. Therefore, portions of the phase change material layer PCM that overlap the word lines WL, may serve as data storage layers of memory cells MC.

Each of the first and second insulating layers IL1 and IL2 may include an oxide layer. In addition, each of the first and second insulating layers IL1 and IL2 may have a pillar shape including a central portion completely filled. The first and second insulating layers IL1 and IL2 may overlap the first and second selection lines SL1 and SL2, respectively.

The channel layer CH may have a tubular shape. The first and second insulating layers IL1 and IL2, and the phase change material layer PCM may be formed in the channel layer CH having the tubular shape. In addition, upper and lower parts of the channel layer CH may have a pillar shape in order to reduce contact resistance. For example, the channel layer CH may have a combination of a pillar shape and a tubular shape.

According to the above-described structure of the resistive memory device, each of the memory cells MC may include the channel layer CH, the phase change material layer PCM formed in the channel layer CH, the word line WL surrounding the channel layer CH, and the gate insulating layer GIL interposed between the channel layer CH and the word line WL. Therefore, the memory cell MC may have a gate-all-around (GAA) structure in which the word line WL surrounds the channel layer CH, so that driving characteristics may be improved during a program operation or an erase operation.

Figure 2A:
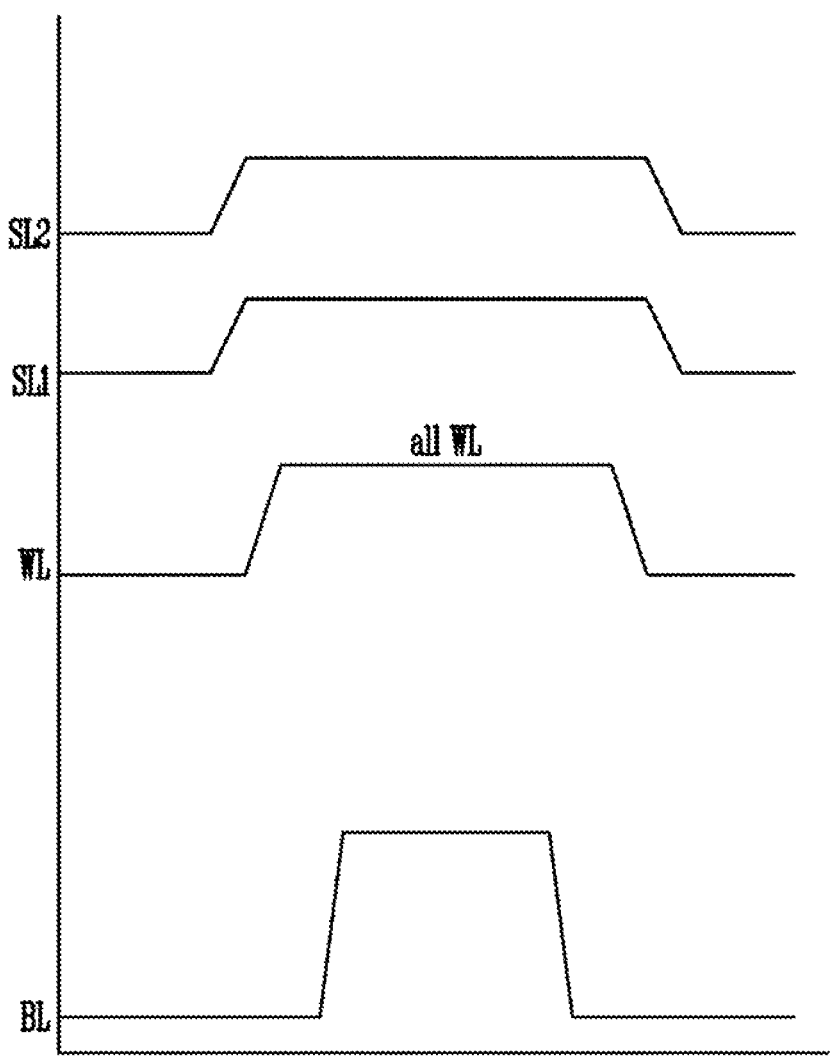
FIG. 2A is a timing diagram illustrating erase operation conditions of a resistive memory device according to an embodiment of the present invention.

FIG. 2A is a timing diagram illustrating erase operation conditions of a resistive memory device according to an embodiment of the present invention. FIG. 2B is a timing diagram illustrating program operation conditions of a resistive memory device according to an embodiment of the present invention.

A resistive memory device according to an embodiment of the present invention may perform an erase operation in units of memory blocks and subsequently perform a program operation in units of memory cells.

The resistive memory device may perform an erase operation by using a set operation in which a phase change material layer transitions from an amorphous state to a crystalline state. For example, memory cells may be half turned on by applying a predetermined voltage to each of the word lines WL of a selected memory block so that a predetermined degree of resistance may exist in a channel layer. Subsequently, after a set pulse is applied to the bit line BL, first and second selection transistors may be turned on by applying predetermined voltages to the first and second selection lines SL1 and SL2, respectively. As a result, each of the memory cells in the selected memory block may be transitioned to a low resistive crystalline phase, and data of "0" may be written to each memory cell.

The resistive memory device may perform a program operation by using a reset operation in which a phase change material layer transitions from a crystalline state to an amorphous state. For example, a selected memory cell may be turned off by applying a ground voltage to the selected word line WL, and unselected memory cells may be completely turned on by applying predetermined voltages to the unselected word lines WL. Subsequently, a reset pulse may be applied to the bit line BL, first and second selection transistors may be turned on by applying predetermined voltages to the first and second selection lines SL1 and SL2, respectively. As a result, the selected memory cell may be transitioned to a high resistive amorphous state, and data of "1" may be written to the selected memory cell.

A pulse may be applied for a longer period of time during an erase operation than during a program operation. Therefore, as compared to an example in which data are written in units of memory cells, a driving speed may be increased by performing an erase operation requiring a relatively long time in units of memory blocks and subsequently performing a program operation requiring a relatively short time in units of memory cells.

Figure 3:
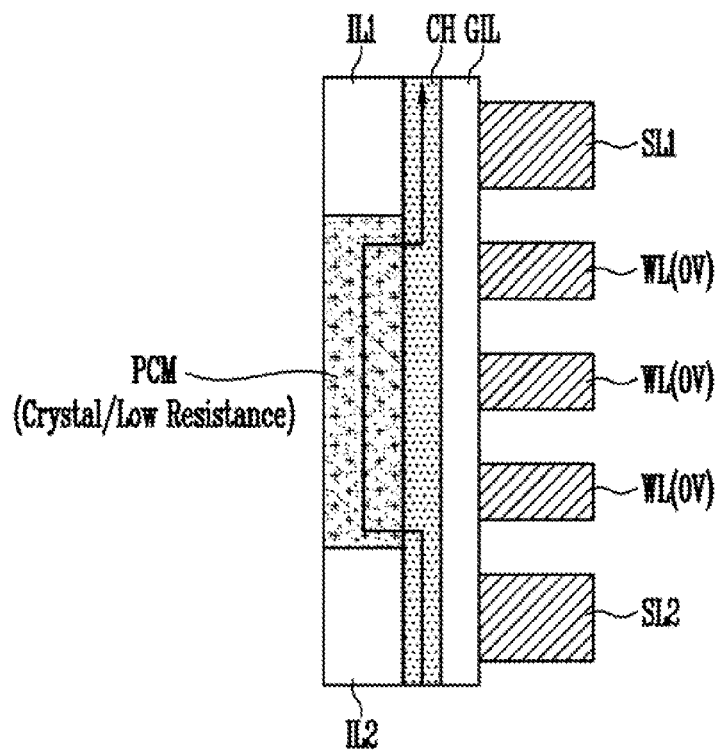
Figure 4A:
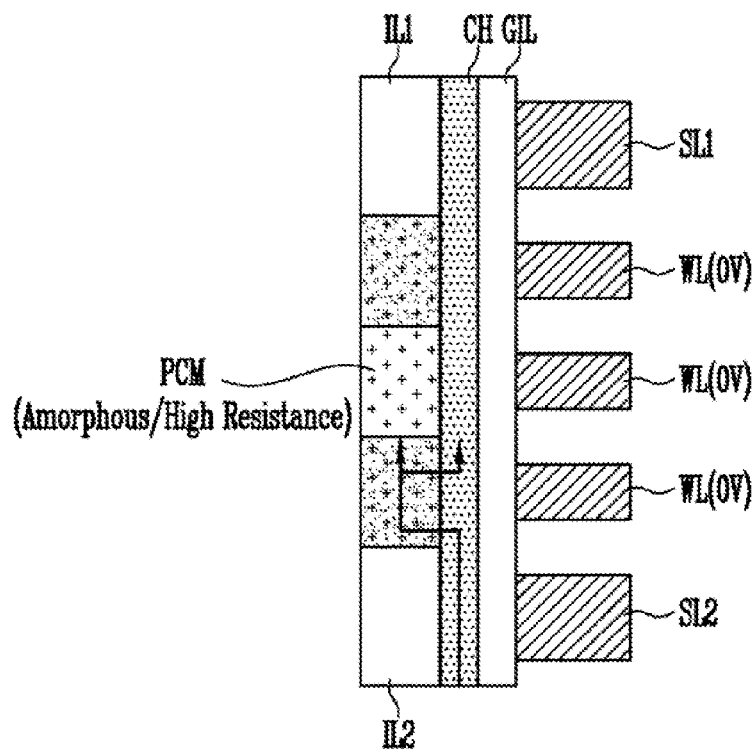

FIG. 3 and FIGS. 4A and 4B are cross-sectional views illustrating a current path of a resistive memory device according to an embodiment of the present invention.

As illustrated in FIG. 3, after an erase operation performed, the phase change material layer PCM of each of the memory cells may have a low resistive crystalline state. In other words, data of "0" may be written in each of the memory cells. When the word lines WL are grounded, the channel layer CH may allow current to flow through a selection transistor region, and the phase change material layer PCM may allow current to flow through a memory cell region. For reference, 0V may correspond to a level at which a memory cell is turned on or off, depending on a state of a phase change material layer. According to this level, a memory cell in an erase state (for example, data of "0") may be turned on, and a memory cell in a program state (for example, data of "1") may be turned off.

FIGS. 4A and 4B illustrate a case in which a program operation is performed on a predetermined memory cell after an erase operation is performed. A programmed memory cell may have a greater threshold voltage than erased memory cells. Therefore, when each of the word lines WL is grounded, a programmed memory cell may be turned off, and current may not flow therethrough (see FIG. 4A). In addition, the word line WL coupled to the programmed memory cell may be turned on, and other word lines WL may be grounded, so that current may flow through the current channel layer CH (see FIG. 4B).

For reference, a read voltage Vread may correspond to a level at which memory cells may be turned on regardless of the state of the phase change material layer.

FIGS. 5A to 5D are cross-sectional views illustrating a process flow for a method of manufacturing a resistive memory device according to an embodiment of the present invention.

As illustrated in FIG. 5A, at least one first material layer 11 and at least one second material layer 12 may be formed alternately with each other on a substrate 10 that includes a lower structure such as source. The first material layer 11 may be provided to form a second selection gate, and the second material layer 12 may be provided to form an interlayer insulating layer. The first material layer 11 and the second material layer 12 may include materials having a high etch selectivity with respect to each other.

Subsequently, a plurality of third material layers 13 and a plurality of fourth material layers 14 may be formed alternately with each other. The third material layers 13 may be provided to form control gates of memory cells, and fourth material layers 14 may be provided to form interlayer insulating layers. The third material layers 13 and the fourth material layers 14 may include materials having a high etch selectivity with respect to each other.

Subsequently, at least one fifth material layer 15 and at least one sixth material layer 16 may be formed alternately with each other. The fifth material layer 15 may be provided to form a first selection gate, and the sixth material layer 16 may be provided to form an interlayer insulating layer. The fifth material layer 15 and the sixth material layer 16 may include materials having a high etch selectivity with respect to each other.

For example, the first, third or fifth material layer 11, 13, or 15 may include a conductive layer such as a polysilicon layer. The second, fourth or sixth material layer 12, 14, or 16 may include an insulating layer such as an oxide layer. In another example, the first, third or fifth material layer 11, 13, or 15 may include a conductive layer such as a doped polysilicon layer or a doped amorphous silicon layer. The second, fourth or sixth material layer 12, 14, or 16 may include a sacrificial layer such as an undoped polysilicon layer or an undoped amorphous silicon layer. In yet another example, the first, third or fifth material layer 11, 13, or 15 may include a sacrificial layer such as a nitride layer. The second, fourth or sixth material layer 12, 14, or 16 may include an insulating layer such as an oxide layer.

For reference, the first, third and fifth material layers 11, 13 and 15 may have the same or different thicknesses. For example, each of the first and fifth material layers 11 and 15 may have a greater thickness than that of the third material layer 13.

In addition, the first, third and fifth material layers 11, 13 and 15 may include the same or different materials. For example, each of the first and fifth material layers 11 and 15 may include a conductive layer, and each of the third material layers 13 may include a sacrificial layer. Alternatively, each of the first, third and fifth material layers 11, 13 and 15 may include a sacrificial layer.

According to the present embodiment, a description will be made to an example in which each of the first, third and fifth material layers 11, 13 and 15 includes a sacrificial layer, and each of the second, fourth and sixth material layers 12, 14 and 16 includes an insulating layer.

Subsequently, at least one hole may be formed through the first to sixth material layers 11 to 16, and a gate insulating layer 17 may be formed in the hole. For example, after the gate insulating layer 17 is formed along an inner surface of the hole, the substrate 10 may be exposed by etching the gate insulating layer 17 formed along a bottom surface of the hole.

Subsequently, a channel layer 18 may be formed on the gate insulating layer 17. The channel layer 18 may be formed in a tubular shape manner having an open central portion. Alternatively, the channel layer 18 may be formed along the inner surface of the hole, so that a lowermost portion of the channel layer 18 may have a pillar shape, and other portions thereof may have a tubular shape.

Figure 5B:
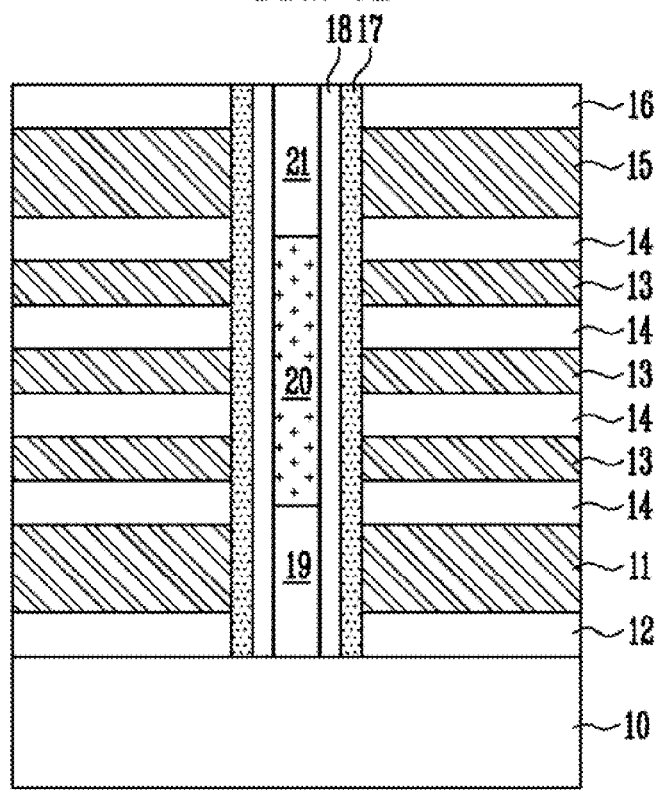

As illustrated in FIG. 5B, a first insulating layer 19 may be formed in a lower part of the hole in which the channel layer 18 is formed. For example, the first insulating layer 19 may be formed over a resulting structure including the channel layer 18 so as to fill the hole, and a first recessed region may be formed in the channel layer 18. The first recessed region may be formed by etching the first insulating layer 19 so that a top surface of the first insulating layer 19 may be located between a top surface of the first material layer 11 and a bottom surface of the lowermost third material layer 13.

Subsequently, a phase change material layer 20 may be formed in the hole in which the first insulating layer 19 is formed. For example, the phase change material layer 20 may be formed over a resulting structure including the first insulating layer 19 so as to fill the hole, and subsequently, a second recessed region may be formed in the channel layer 18. The second recessed region may be formed by etching the phase change material layer 20 so that a top surface of the phase change material layer 20 may be located between a top surface of the uppermost third material layer 13 and a bottom surface of the fifth material layer 15.

The phase change material layer 20 may have a pillar shape including a central portion completely filled, a tubular shape including an open central region, or a combination thereof. When the phase change material layer 20 has a tubular shape, an open central region thereof may be filled with an insulating layer.

Subsequently, a second insulating layer 21 may be formed in an upper part of the hole. For example, the second insulating layer 21 may be formed over a resulting structure including the phase change material layer 20 so as to fill the hole, and subsequently, a planarization process may be performed until a top surface of the sixth material layer 16 is exposed.

Figure 5C:
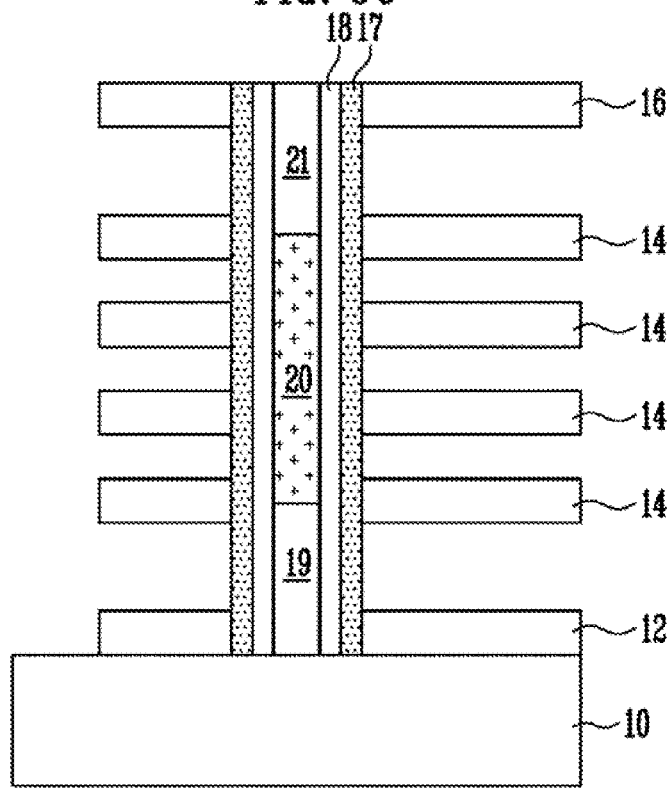

As illustrated in FIG. 5C, at least one slit may be formed through the first to sixth material layers 11 to 16, and the first, third and fifth material layers 11, 13 and 15 exposed through the slit may be etched to form third recessed regions.

As illustrated in FIG. 5D, conductive layers 22 may be formed in the third recessed regions. Subsequently, a third insulating layer 23 may be formed in the slit. An air gap may be formed in the slit by controlling deposition conditions of the third insulating layer 23.

At least one uppermost conductive layer 22 may be a first selection line, at least one lowermost conductive layer 22 may be a second selection line, and the rest of the conductive layers 22 may be word lines.

By performing the above-described manufacturing processes, a resistive memory device that includes the memory cells stacked along the channel layer 18 may be manufactured. Therefore, a degree of integration of the resistive memory device may be increased.

Various changes may be made to the above-described manufacturing processes, particularly to the processes subsequent to the formation of the slit, depending on materials of the first to sixth material layers 11 to 16.

For example, the first, third or fifth material layer 11, 13, or 15 may include a conductive layer, and the second, fourth or sixth material layer 12, 14, or 16 may include an interlayer insulating layer. In this example, after the slit is formed, the first, third and fifth material layers 11, 13 and 15 exposed through the slit may be silicided. Subsequently, the third insulating layer 23 may be formed in the slit.

In another example, the first, third or fifth material layer 11, 13, or 15 may include a conductive layer, and the second, fourth or sixth material layer 12, 14, or 16 may include a sacrificial layer. In this example, the second, fourth and sixth material layer 12, 14 and 16 exposed through the slit may be etched to form recessed regions. Subsequently, the first, third and fifth material layer 11, 13 and 15 exposed through the slit may be silicided. Insulating layers may be formed in the recessed regions. Subsequently, the third insulating layer 23 may be formed in the slit.

Figure 6:
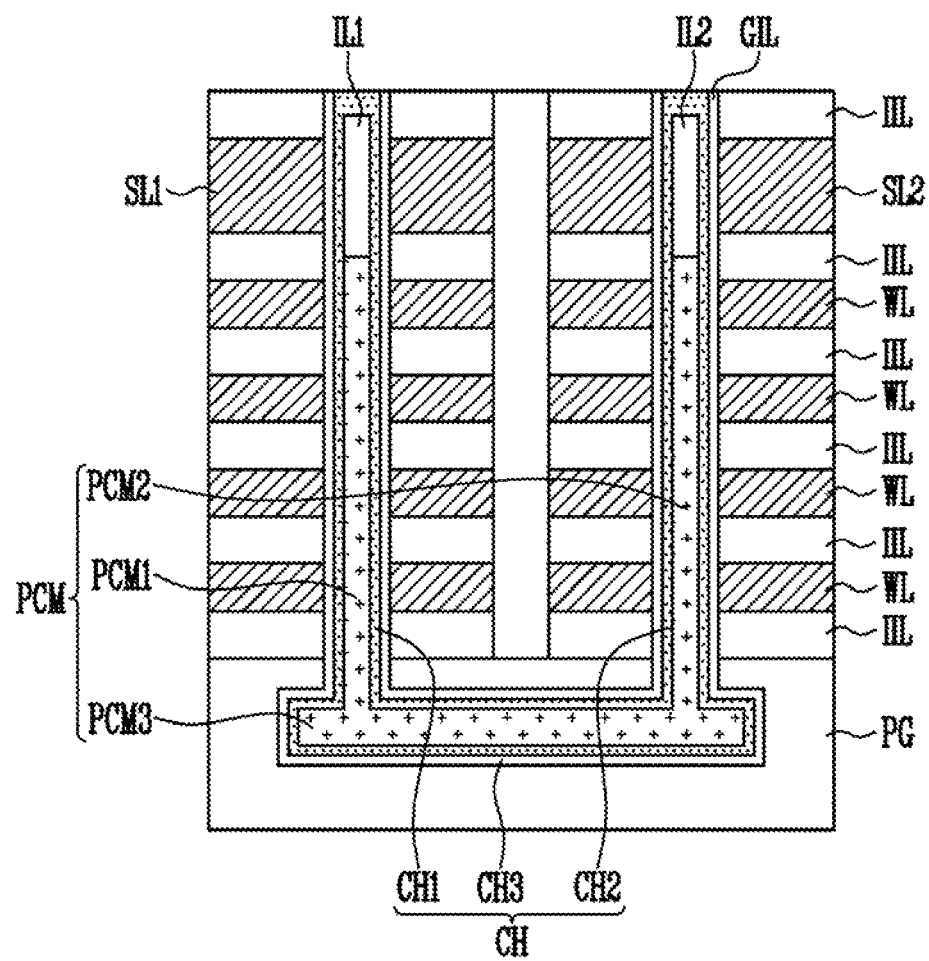
FIG. 6 is a cross-sectional view illustrating a structure of a resistive memory device according to another embodiment of the present invention.

FIG. 6 is a cross-sectional view illustrating a structure of a resistive memory device according to another embodiment of the present invention. Hereinafter, a description of the contents of this embodiment, the same as those of the above-described embodiment is omitted.

As illustrated in FIG. 6, a resistive memory device may include a pipe gate PG, word lines WL, at least one first selection line SL1, a first channel layer CH1, a first phase change material layer PCM1 and a first insulating layer IL1. The word lines WL may be stacked over the pipe gate PG. The at least one first selection line SL1 may be formed over the word lines WL. The first channel layer CH1 may pass through the word lines WL and the first selection line SL1. The first phase change material layer PCM1 may be formed in the first channel layer CH1 and overlap the word lines WL. The first insulating layer IL1 may be formed in the first channel layer CH1 and overlap the first selection line SL1.

The resistive memory device may include at least one second selection line SL2, a second channel layer CH2, a second phase change material layer PCM2, a second insulating layer IL2 and a third channel layer CH3. The at least one second selection line SL2 may be formed on the word lines WL. The second channel layer CH2 may pass through the word lines WL and the second selection line SL2. The second phase change material layer PCM2 may be formed in the second channel layer CH2 and overlap the word lines WL. The second insulating layer IL2 may be formed in the second channel layer CH2 and overlap the second selection line SL2. The third channel layer CH3 may be formed in the pipe gate PG and couple the first and second channel layers CH1 and CH2 to each other. The first and second channel layers CH1 and CH2 are configured as cell channel layers for memory cells, and the third channel layer CH3 is configured as a pipe channel layer for a pipe transistor.

In addition, the resistive memory device may further include interlayer insulating layers IIL, the gate insulating layer GIL and a third phase change material layer PCM3. The interlayer insulating layers IIL may be interposed between the word lines WL stacked on top of one another, the first selection lines SL1 and the second selection lines SL2. The gate insulating layer GIL may surround the channel layer CH. The third phase change material layer PCM3 may be formed in the third channel layer CH3.

A method of manufacturing a semiconductor device will be described now in brief. First, a trench may be formed in the pipe gate PG, and a sacrificial layer may be formed in the trench. Subsequently, a plurality of first material layers and a plurality of second material layers may be formed alternately with each other on the pipe gate PG, and at least one third material layer and at least one fourth material layer may be formed alternately with each other. Subsequently, holes may be formed through the first to fourth material layers. At least two holes may be coupled to each trench. Subsequently, a sacrificial layer exposed along bottom surfaces of the holes may be removed, and the gate insulating layer GIL and the channel layer CH may be sequentially formed in the trench and the holes. Subsequently, the phase change material layer PCM may be formed in the channel layer CH, and the phase change material layer PCM may be etched to form a first recessed region in the channel layer CH. Subsequently, the first and second insulating layers IL1 and IL2 may be formed in the first recessed region. Subsequently, the first and second insulating layers IL1 and IL2 may be etched to form a second recessed region, and the channel layer CH may further be formed in the second recessed region. Subsequently, a slit may be formed through the first to fourth material layers. Subsequently, the first to third material layers exposed through the slit may be removed to form third recessed regions, and conductive layers may be formed in the third recessed regions. As a result, the word lines WL, the first selection line SL1 and the second selection line SL2 may be formed. The word lines WL may be formed by replacing the first material layers with conductive layers, and the first and second selection lines SL1 and SL2 may be formed by replacing the third material layers with conductive layers.

For reference, as described above, various changes may be made to the processes subsequent to the formation of the slit, depending on materials of the materials of the first to fourth material layers.

Figure 7:
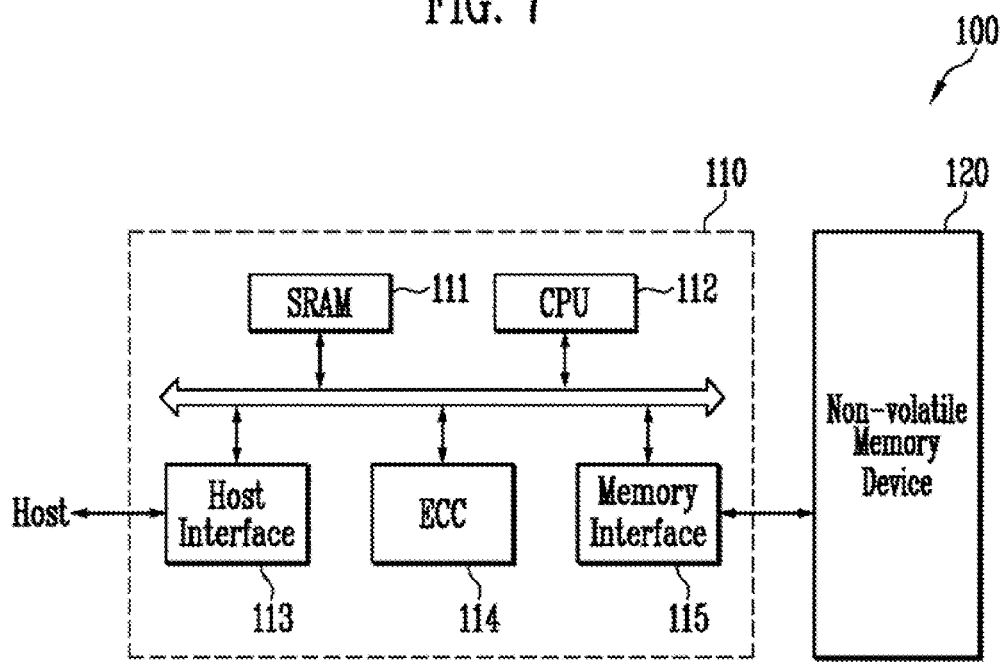
FIG. 7 is a block diagram illustrating the configuration of a memory system according to an embodiment of the present invention.

FIG. 7 is a view illustrating the configuration of a memory system according to an embodiment of the present invention.

As illustrated in FIG. 7, a memory system 100 according to an embodiment of the present invention may include a non-volatile memory device 120 and a memory controller 110.

The non-volatile memory device 120 may have a structure according to the layout as described above. In addition, the non-volatile memory device 120 may be a multi-chip package composed of a plurality of flash memory chips.

The memory controller 110 may be configured to control the non-volatile memory device 120. The memory controller 110 may include SRAM 111, a CPU 112, a host interface 113, an ECC 114 and a memory interface 115. The SRAM 111 may function as an operation memory of the CPU 112. The CPU 112 may perform the general control operation for data exchange of the memory controller 110. The host interface 113 may include a data exchange protocol of a host being coupled to the memory system 100. In addition, the ECC 114 may detect and correct errors included in a data read from the non-volatile memory device 120. The memory interface 115 may interface with the non-volatile memory device 120. The memory controller 110 may further include ROM that stores code data to interface with the host.

The memory system 100 having the above-described configuration may be a solid state disk (SSD) or a memory card in which the memory device 120 and the memory controller 110 are combined. For example, when the memory system 100 is an SSD, the memory controller 110 may communicate with the outside (e.g., a host) through one of the interface protocols including USB, MMC, PCI-E, SATA, PATA, SCSI, ESDI and IDE.

Figure 8:
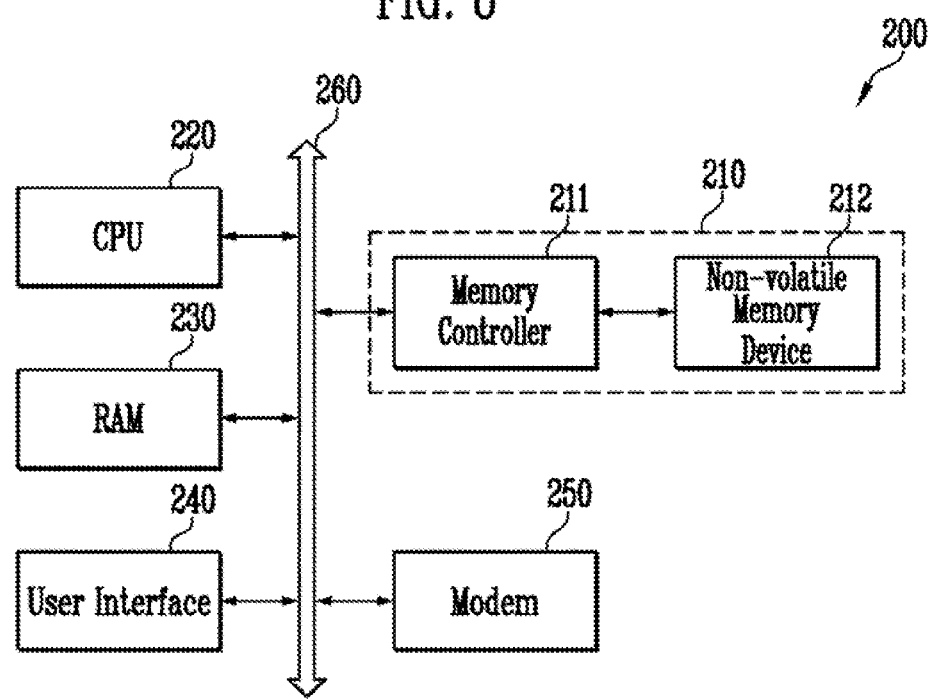
FIG. 8 is a block diagram illustrating the configuration of a computing system according to an embodiment of the present invention.

FIG. 8 is a block diagram illustrating the configuration of a computing system according to an embodiment of the present invention.

As illustrated in FIG. 8, a computing system 200 according to an embodiment of the present invention may include a CPU 220, RAM 230, a user interface 240, a modem 250 and a memory system 210, which are electrically coupled to a system bus 260. In addition, when the computing system 200 is a mobile device, a battery may be further included to apply operating voltage to the computing system 200. The computing system 200 may further include application chipsets, a CMOS Image Sensor (CIS) and mobile DRAM.

As described above with reference to FIG. 8, the memory system 210 may include a non-volatile memory device 212 and a memory controller 211.

According to embodiments of the present invention, since memory cells including phase change material layers are stacked on top of one another, a degree of integration of a resistive memory device may be increased. In addition, since a program operation is performed in units of memory cells after an erase operation is performed in units of memory blocks, a driving speed may be increased.

What is claimed is:

1. A resistive memory device, comprising:
   first word lines stacked on top of one another;
   at least one first selection line formed over the first word lines;
   a first channel layer passing through the first word lines and the first selection line;
   a first phase change material layer formed within the first channel layer and overlapping the first word lines; and
   a first insulating layer formed within the first channel layer and overlapping the first selection line,
   wherein the first channel layer is positioned between the first phase change material layer and the first word lines.

2. The resistive memory device of claim 1, further comprising:
   at least one second selection line formed under the first word lines; and
   a second insulating layer formed within the first channel layer and overlapping the second selection line.

3. The resistive memory device of claim 1, further comprising:
   second word lines stacked on top of one another;
   a second selection line formed over the second word lines;
   a second channel layer passing through the second word lines and the second selection line;
   a third channel layer coupling the first channel layer and the second channel layer to each other;
   a second phase change material layer formed within the second channel layer and overlapping the second word lines; and
   a second insulating layer formed within the second channel layer and overlapping the second selection line.

4. The resistive memory device of claim 1, wherein the first phase change material layer has a tubular shape, a pillar shape, or a combination thereof.

5. The resistive memory device of claim 1, further comprising a gate insulating layer interposed between the first channel layer and the first word lines and between the first channel layer and the first selection line.

6. The resistive memory device of claim 1, wherein the resistive memory device is suitable for performing an erase operation in units of memory blocks and subsequently performing a program operation in units of memory cells.

7. A method of manufacturing a resistive memory device, the method comprising:
   alternately forming a plurality of first material layers and a plurality of second material layers with each other;
   alternately forming at least one third material layer and at least one fourth material layer with each other on the plurality of first and second material layers;
   forming at least one hole through the first to fourth material layers;
   forming a channel layer in the hole;
   forming a first phase change material layer within the channel layer so that the channel layer is positioned between the first phase change material layer and the third material layer;
   forming a first recessed region within the channel layer; and
   forming a first insulating layer within the first recessed region.

8. The method of claim 7, wherein the forming of the first recessed region comprises etching the first phase change material layer so that a top surface of the first phase change material layer is lower than a bottom surface of the third material layer.

9. The method of claim 7, further comprising:
   alternately forming the at least one fifth material layer and the at least one sixth material layer with each other before the alternately forming of the first and second material layers;
   forming a second insulating layer within the channel layer before forming the first phase change material; and
   forming a second recessed region within the channel layer.

10. The method of claim 7, further comprising:
    forming a conductive layer before the alternately forming of the first and second material layers;
    forming a trench in the conductive layer, wherein the trench is coupled to the hole;
    forming a sacrificial layer in the trench;
    removing the sacrificial layer exposed through the hole; and
    forming a pipe channel layer in the trench, wherein the pipe channel layer is coupled to the channel layer in the hole.

11. The method of claim 7, further comprising forming a gate insulating layer in the hole before the forming of the channel layer.

12. The resistive memory device of claim 6, wherein the resistive memory device is suitable for performing the erase operation for a longer period of time than the program operation.

13. A resistive memory device, comprising:
    word lines stacked on top of one another;
    a first phase change material layer passing through the word lines; and
    a first channel layer surrounding the first phase change material layer so that the first channel layer is positioned between the word lines and the first phase change material layer.

14. The resistive memory device of claim 13, further comprising:
    at least one first selection line formed over the word lines;
    a first insulating layer formed within the first channel layer, wherein the first selection line surrounds the first insulating layer.

15. The resistive memory device of claim 14, further comprising:
    at least one second selection line formed under the word lines; and
    a second insulating layer formed within the first channel layer, wherein the second selection line surrounds the second insulation layer.

16. The resistive memory device of claim 13, wherein the resistive memory device is suitable for performing an erase operation in units of memory blocks and subsequently performing a program operation in units of memory cells.

17. The resistive memory device of claim 15, wherein the resistive memory device is suitable for performing the erase operation for a longer period of time than the program operation.

* * * * *